United States Patent [19]

Alexander et al.

[11] Patent Number: 4,922,606
[45] Date of Patent: May 8, 1990

[54] METHOD OF MAKING A CURRENT SENSOR

[75] Inventors: Michael Alexander, Fife; Fiona G. Riddoch, Edinburgh, both of Scotland

[73] Assignee: Honeywell Inc., Minneapolis, Minn.

[21] Appl. No.: 259,223

[22] Filed: Oct. 18, 1988

[30] Foreign Application Priority Data

Oct. 30, 1987 [GB] United Kingdom ............... 8725467

[51] Int. Cl.$^5$ ..................... H05K 3/34; G11B 5/127; H01F 7/06
[52] U.S. Cl. ................................. 29/839; 29/603; 29/834; 29/860; 29/871; 360/113
[58] Field of Search ............ 29/602.1, 603, 834, 29/840, 839, 860, 871; 360/111, 113, 121, 122, 123, 127

[56] References Cited

U.S. PATENT DOCUMENTS

| | | | |
|---|---|---|---|
| 4,314,297 | 2/1982 | Lazzari | 360/113 |
| 4,435,900 | 3/1984 | de Wilde | 29/603 |
| 4,546,541 | 10/1985 | Reid | 29/603 |
| 4,550,353 | 10/1985 | Hirai et al. | 29/603 |
| 4,571,651 | 2/1986 | Reid et al. | 29/603 X |
| 4,589,043 | 5/1986 | Grundtner | 29/603 X |
| 4,642,716 | 2/1987 | Wakabayashi et al. | 360/113 X |
| 4,652,954 | 3/1987 | Church | 29/603 X |
| 4,783,711 | 11/1988 | Kitada et al. | 360/113 |

FOREIGN PATENT DOCUMENTS

| | | | |
|---|---|---|---|
| 98821 | 6/1983 | Japan | 360/113 |
| 126618 | 6/1986 | Japan | 360/113 |

OTHER PUBLICATIONS

C. Tsand and R. E. Fontana, Jr., "Fabrication and Wafer Testing of Barber–Pole and Exchange–Biased Narrow–Track MR Sensors," IEEE Trans. on Magnetics, vol. Mag–18, No. 6, Nov. 1982.

B. Baranowski, W. Kwiatkowski, and S. Tumanski, "Application of the Thin Film Permalloy Magnetoresistive Sensors in Electrical Measurements," IEEE Trans. on Magnetics, vol. Mag–20, No. 5, Sep. 1984.

Primary Examiner—Joseph M. Gorski
Assistant Examiner—Peter Vo
Attorney, Agent, or Firm—Clyde C. Blinn

[57] ABSTRACT

A method of making a current sensor device is disclosed wherein a sensor, having a magnetoresistive element configured into a bridge, an insulating substrate and a conductive member are sub-assembled and then the sub-assembly is heated to bond the components together. The bridge is attached to a first substrate having a first layer of insulation with first vias therein in which are deposited first elements of solder projecting beyond the first layer of insulation. Second elements of (e.g.) solder are deposited in second vias in a second layer of insulation on the second substrate. When the components are sub-assembled, the first elements rest on the second elements to provide a clearance between the first and second layers of insulation. Heat is applied to the sub-assembly in a controlled manner so that the (solder) elements melt sufficiently to cause a degree of self-alignment between the bridge and the conductive member and to cause the bridge to be disposed at a predetermined distance above the conductive member.

9 Claims, 5 Drawing Sheets

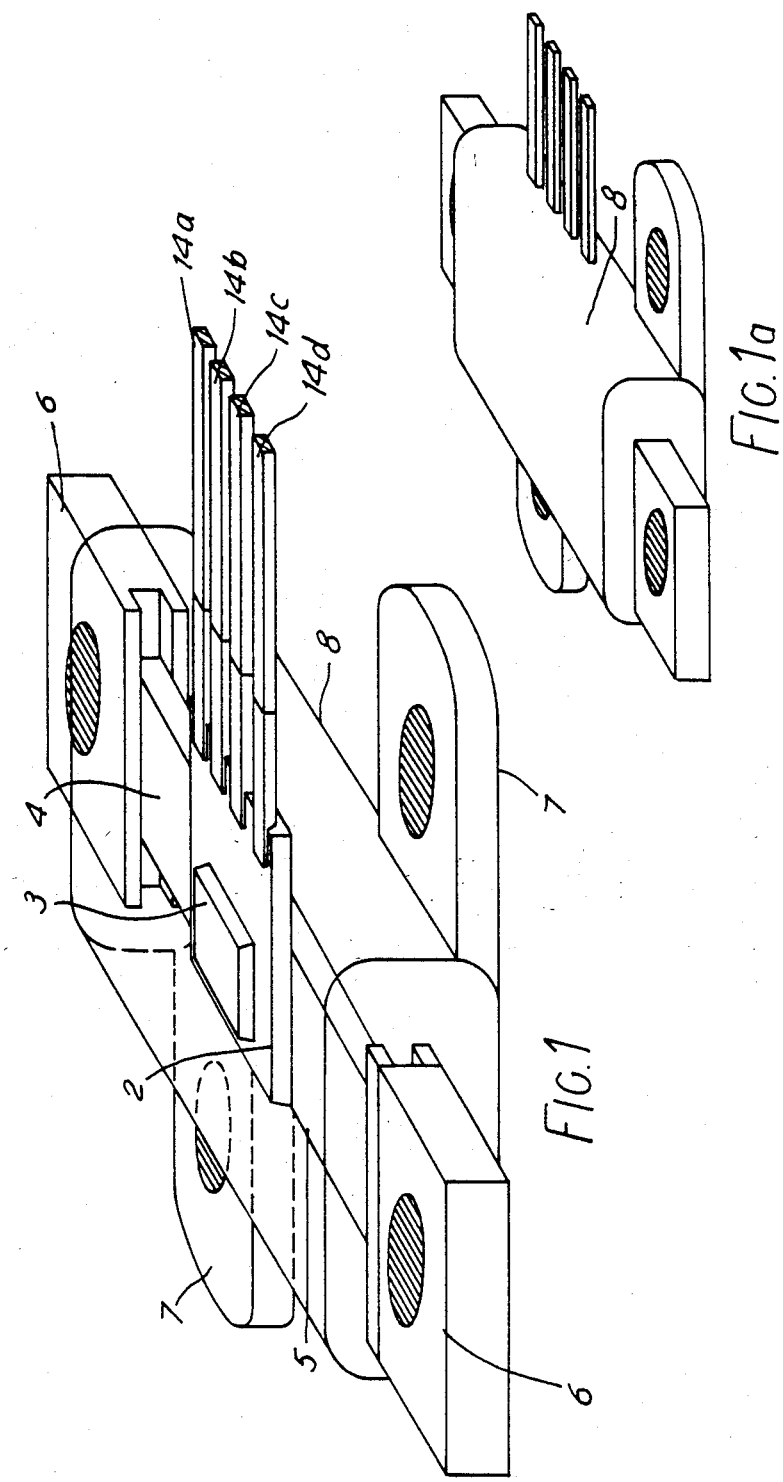

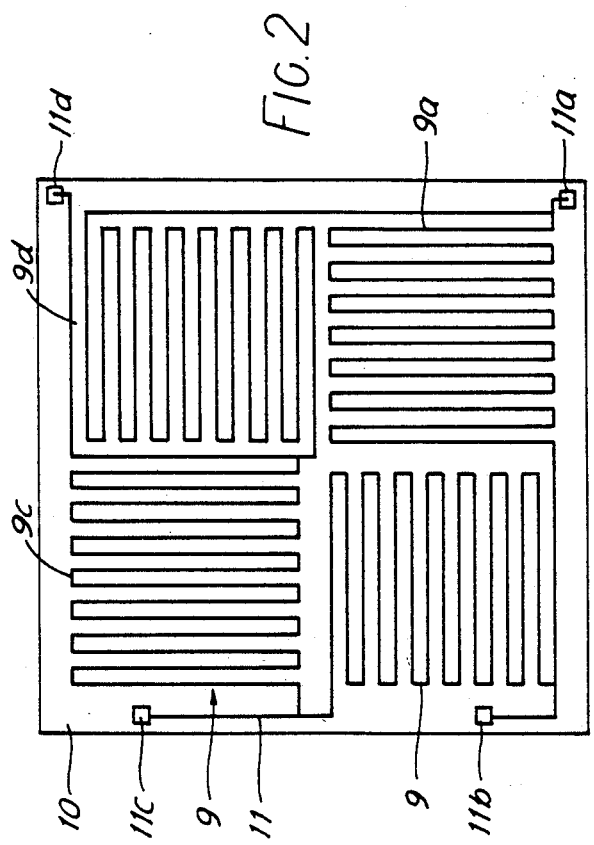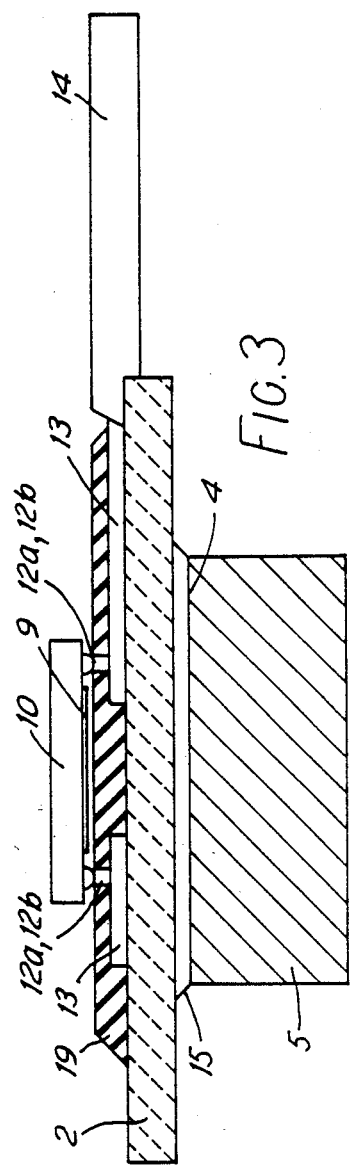

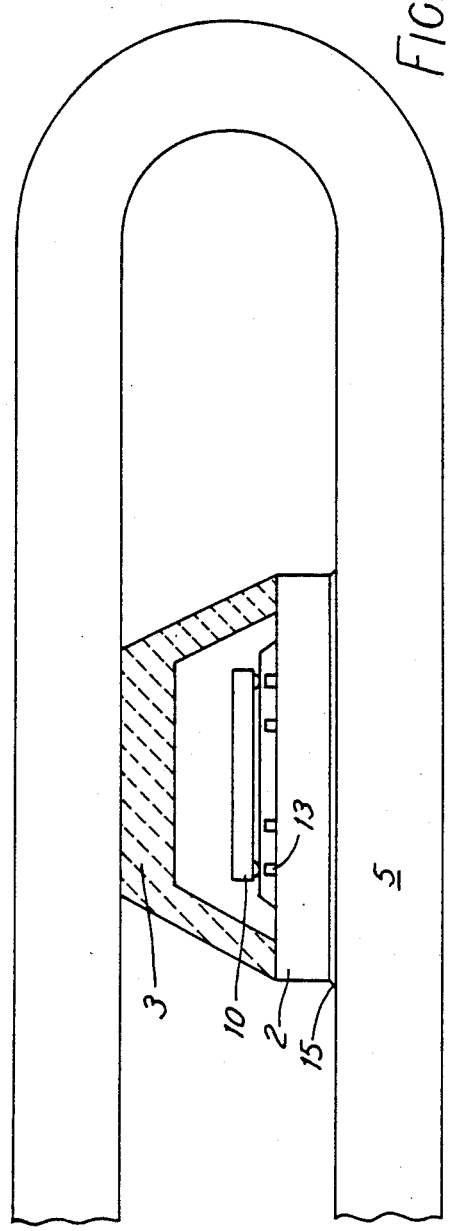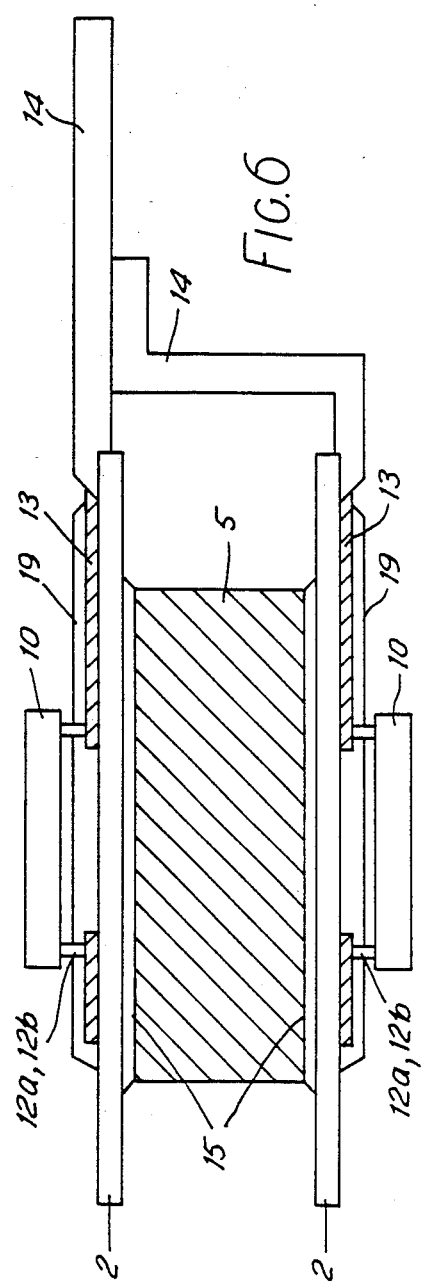

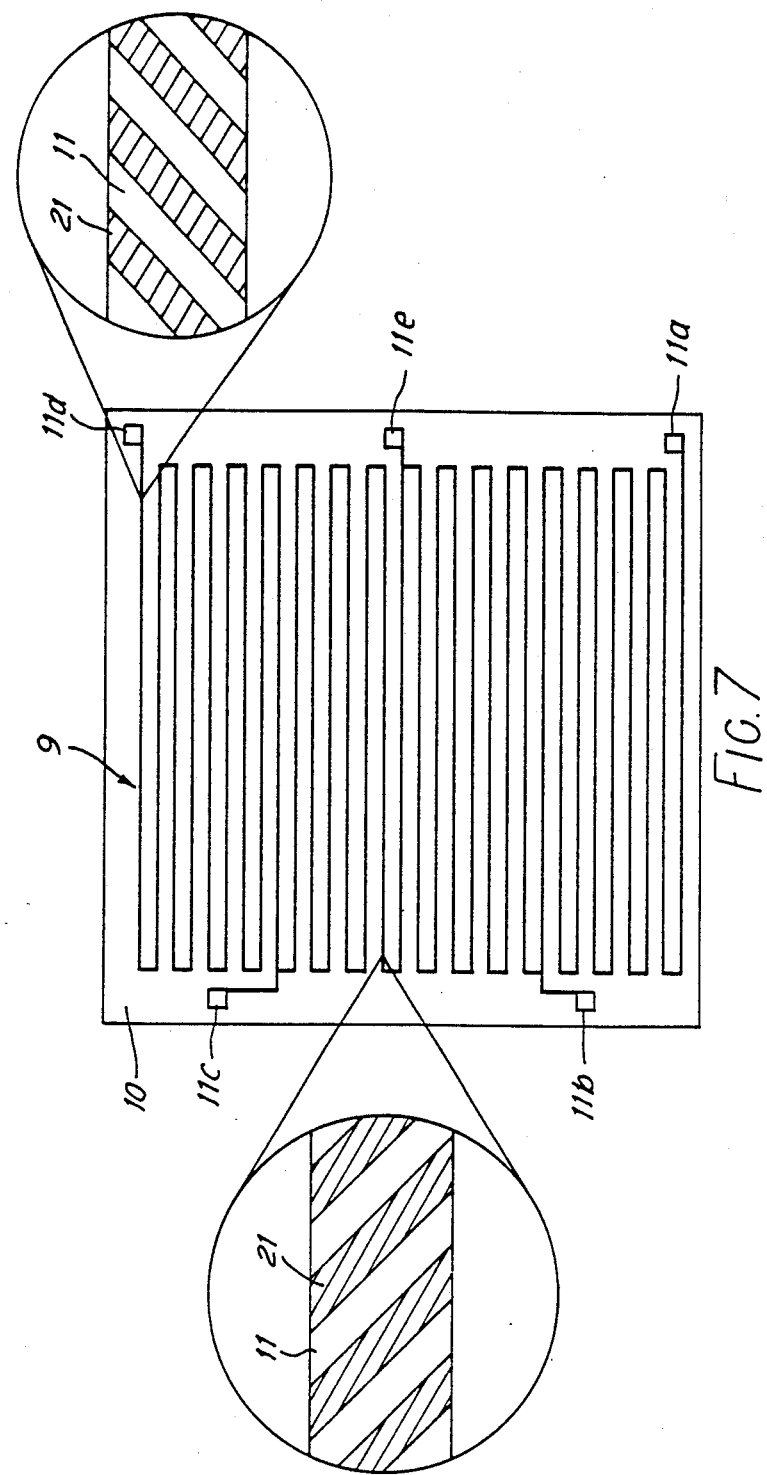

METHOD OF MAKING A CURRENT SENSOR

BACKGROUND OF THE INVENTION

The invention relates to a method of making a current sensor having a magnetoresistive element configured into a bridge. The sensor may be used to measure DC, AC, or pulsed current and, particularly, high currents of the order of a few amps to several hundred amps.

It is known to employ thin film permalloy (Ni/Fe) magnetoresistive bridge sensors (herefoth called MR sensors) as power converters in the design of electrical energy meters (see, for example, the IEEE Transactions on Magnetics, VOL. MAG-20, No. 5, September 1984, pages 966–968-Kwiatkowski et al). It is also known to employ Barber-pole biasing with MR sensors, for sensing magnetic fields, in order to provide a linear bridge output (see, for example, the IEEE Transactions on Magnetics, VOL. MAG-18, No. 6, November 1982, pages 1149–1151-Tsang and Fontana). However, to the best of our knowledge, no successful attempt has yet been made to mass-produce devices employing MR sensors which are primarily intended for sensing current.

The present invention provides a method of making a current sensing device by mounting an MR sensor on a conductive member. Such a sensor responds to the magnetic field created by the current flowing in the conductive member, the output of the bridge being proportional to the current flow. Whilst it may appear to be a relatively straightforward matter to manufacture such a device, a technique must be found for mass-producing devices having consistent performance characteristics. For example, the resistance of the sensor depends on the strength of the magnetic field in the region where the sensor is located and variations in the spacing between the sensor and the conductive member can have a drastic effect on field strength. This leads to the problem of trying to position the sensor accurately with respect to the conductive member. The present invention seeks to solve this problem.

SUMMARY OF THE INVENTION

The invention provides a method of making a current sensing device comprising a sensor, an insulating substrate and a conductive member for conducting the current to be sensed by said sensor; said sensor including a magnetoresistive element configured into a bridge and said substrate being either provided for attachment, or attached to said conductive member; the method including the steps of:

(a) assembling said sensor, said substrate and said conductive member so that said sensor is supported by elements of thermally softenable material; said substrate being disposed between said sensor and said conductive member; and (b) applying heat, in a controlled manner, to the assembly, so as to cause said elements to melt sufficiently to cause said bridge to be disposed at a predetermined distance from the surface of the conductive member; said sensor being attached to said substrate and said substrate being attached to said conductive member (unless already attached to said conductive member) as a result of the application of said heat.

A preferred embodiment of the invention provides a method of making a current sensing device comprising a magnetoresistive element configured into a bridge the method comprising the steps of:

(a) providing a first insulating substrate on which said bridge is disposed together with a first layer of insulation having first vias therein at predetermined positions in said first layer;

(b) depositing first elements of thermally softenable material in said first vias;

(c) providing a second substrate having a predetermined thickness and on which there is a second layer of insulation with second vias therein at positions corresponding with those of said first vias, said second substrate being provided for attachment, or attached to a surface of an electrically conductive member having a predetermined shape and provided for conducting the current to be sensed;

(d) depositing second elements of thermally softenable material in said second vias;

(e) sub-assembling said first and second substrates and said conductive member so that (i) said second substrate is disposed between said first substrate and said conductive member, (ii) the first and second elements of thermally softenable material are in contact, and (iii) a clearance is provided between said first and second layers of insulation; the positions of said first and second vias being such that, when said first and second substrates are sub-assembled, said bridge has a substantially predetermined orientation with respect to said conductive member.

(g) applying heat to said sub-assembly, in a controlled manner, so as to cause said first and second elements to melt sufficiently to cause a degree of self-alignment of said bridge with respect to said conductive member and to cause said bridge to be disposed substantially parallel to said surface of said conductive member at a predetermined distance therefrom; said first substrate being attached to said second substrate and said second substrate being attached to said conductive member (unless already attached thereto) as a result of the application of said heat.

The thermally softenable material is preferably solder. The solder, the substrate or substrates and the mode of heat treatment may then be selected, for example, in accordance with, or similar to, e.g. known techniques for making glass-to-metal seals.

Preferably, said first elements of thermally softenable material have predetermined dimensions and they project by a predetermined distance beyond the surface of the first insulating layer so that the clearance between the first and second layers of insulation is provided when the components are sub-assembled (alternatively the second, rather than the first elements may project to achieve the same result). The dimensions and disposition of the e.g. first elements, and the way in which the heat is controlled, ensure that the bridge is precisely positioned with respect to the conductive member and this greatly assists in achieving repeatable results in mass production.

The disposition of the second vias is substantially a "mirror image" of the first vias and their dispositions are predetermined so that the bridge has a predetermined orientation with regard to the direction of current flow in the conductive member. Although this can be largely achieved by gross alignment of the components during the sub-assembly, e.g. by mechanically locating the components in a fixture before the sub-assembly is heated, the application of the heat is controlled so that a degree of melting of the thermally softenable elements occurs which (due to surface tension) advantageously provides a final degree of self-alignment of the first substrate with respect to the second substrate and hence more accurately aligns the bridge with regard to (the direction of current flow in) said conductive member. In practice, such self-alignment occurs within tolerable limits i.e. to ensure improved results in a mass production process.

Heat may be applied to the sub-assembly of components by means of, for example, a chain belt furnace having a controlled time/temperature profile and a predetermined belt speed. This enables the sub-assembly to be translated through a hot zone(s), having a predetermined temperature profile, for a predetermined period. (The hot zone(s) preferably have a controlled, non-reactive atmosphere to ensure reliable heat treatment.). The thermally softenable material, e.g. solder, can also be used for the purpose of attaching the (second) substrate to the surface of the conductive member. This enables all of the components of the sub-assembly to be secured together at the same time when the sub-assembly is heated (e.g. transported through the above-mentioned furnace)

Preferably, the shape of the conductive member is predetermined so as to produce a particular magnetic field (for a given current flow) at a precise point above the surface of the conductive member. For example, the conductive member may be in the form of a copper strap having a constant rectangular cross-section. Such a cross-section can be precisely controlled and/or adjusted to provide the required magnetic field at the desired location. Since the method of the invention results in precise positioning of the bridge, the cross-sectional dimensions of the conductive member can be adjusted so as to achieve the required performance characteristics. This avoids the need for any means to provide external adjustment of the field, e.g. either to concentrate, or to control the magnetic flux in the region of the bridge.

The bridge is preferably, although not exclusively, of the Barber-pole type wherein the current vector is rotated to provide a linear bridge output. Where the bridge comprises a configured strip of permalloy (Ni/Fe), Barber-pole biasing may be provided by depositing conductive stripes (e.g. of aluminium), each having a predetermined angle of inclination. Alternatively, a Barber-pole configuration may be provided by alternating stripes of permalloy (Ni/Fe) and a conductive material. The dimensions of the Ni/Fe strip and the dimensions and orientation of the conductive stripes may be varied, within the limits necessary for providing a linear bridge output, to assist in providing the desired performance characteristics. (The Tsang and Fontana paper mentioned above describes typical Barber-pole biasing).

As MR sensors made of permalloy (Ni/Fe) exhibit hysteresis in response to an applied magnetic field, this would normally preclude unambiguous sensing of AC or pulsed currents. Such sensors are also susceptible to magnetic field interference. These effects may be removed, in normal operating conditions, as is known, by applying an auxiliary magnetic field to enforce a particular magnetic field response from the bridge. When the invention is employed to produce AC or pulsed current sensors, processes are preferably used, which are compatible with integrated circuit technology, to provide means for producing an auxiliary magnetic field on-chip. Such means may include either thin film hard ferro-magnets (e.g. cobalt deposited on the chip) to establish an auxiliary magnetic field, or a layer of antiferromagnetic material, such as B phase Fe/Mn (deposited on the chip), which will provide hysteresis suppression through exchange coupling with the permalloy MR sensor.

Mr sensors can be created by sputter deposition on a polished planar insulating material, such as oxidised silicon of: (a) a layer of an anisotropic magnetoresistive material such as alloys of Ni and Fe; (b) a layer of an antiferromagnetic material such as alloys of Mn and Fe; and (c) a layer of an electroconductive material such as Al. These composite layers are then patterned and selectively subtractively etched, using standard semiconductor processing technology, to achieve the bridge pattern appropriate to the desired response regime (i.e. Barber poles/meander pattern resistor, aspect ratio of the pattern, length:width:thickness, interconnection pattern and resistive trim geometry).

A layer of an appropriate insulating material (i.e. the first layer of insulation) can be sputter deposited upon the completed bridge pattern to achieve electrical isolation and environmental protection (e.g. $SiO_2$, $SiN_4$) with access vias defined through the insulating layer by similar methods to those employed in the metal layer definition. The thermally softenable material can be selectively deposited upon the underlying, via exposed, conductive interconnection material, by such methods as sputter deposition, evaporation and electro-less plating, utilizing such known techniques to maximise eutectic alloy junction formation and mechanical strength.

Preferably, the second insulating substrate is ceramic (e.g. $Al_2O_3$) and it has an interconnect pattern, a dielectric insulation layer incorporating vias or voids (to permit eutectic alloy bonding to the underlying interconnection pattern) and a thermally softenable pattern created on one major face by the known industry techniques of screen printing and thermal processing. Its other major face also preferably has a layer of thermally softenable material attached thereto to enable the second substrate to be bonded to the conductive member as a result of the application of heat.

The completed sensor may be enclosed in a protective package of either a soft ferromagnetic material and/or an impregnated polymer to facilitate mechanical, electrical and environmental protection. Such a package also preferably includes mounting means.

BRIEF DESCRIPTION OF THE DRAWING

Embodiments of the invention will now be described with reference to the accompanying schematic drawings, in which:

FIG. 1 is a perspective view of a current sensing device in accordance with one embodiment of the invention (showing encapsulation 8 in a transparent manner), FIG. 1a is a similar perspective view (showing the encapsulation 8 in a solid manner), FIG. 2 is a plan view of a chip comprising a magnetoresistive element configured into a known bridge structure, FIG. 3 is a side elevation, partly in section, showing a sub-assembly which includes the chip of FIG. 2 and an insulating substrate mounted on the upper surface of a copper strap having a rectangular cross-section, FIG. 5 is a longitudinal section of an alternative embodiment for sensing low current.

FIG. 6 is a side elevation, partly in section, of a further embodiment of the invention which utilizes anti-coincidence connected MR sensors, and FIG. 7 is a plan view of a chip having a Barber-pole biased bridge structure with a "push-pull" format, the inserts showing magnified striped portions of the magnetoresistive strip.

DESCRIPTION OF THE PREFERRED EMBODIMENT

Figure 4:
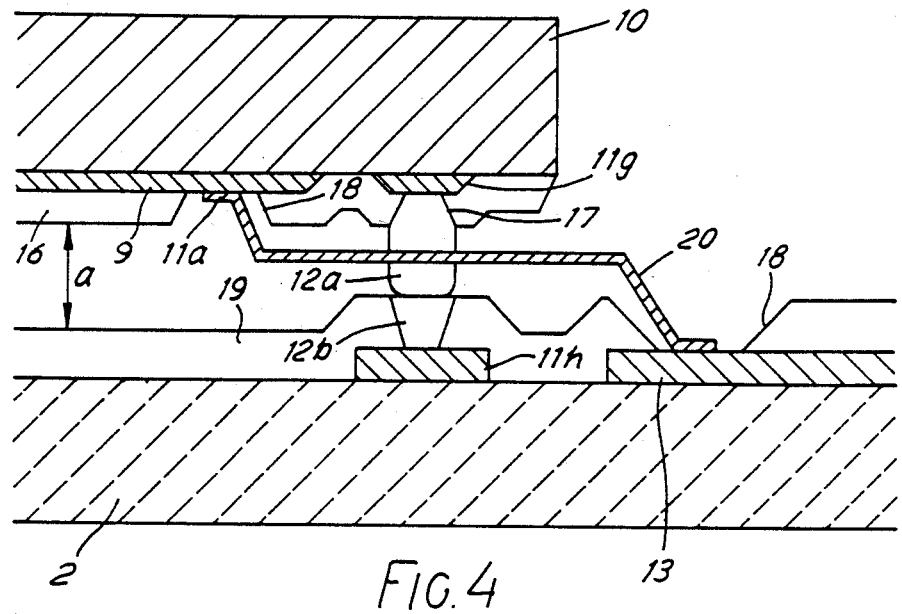
FIG. 4 is an enlargement of a portion of FIG. 3.
Figure 4A:
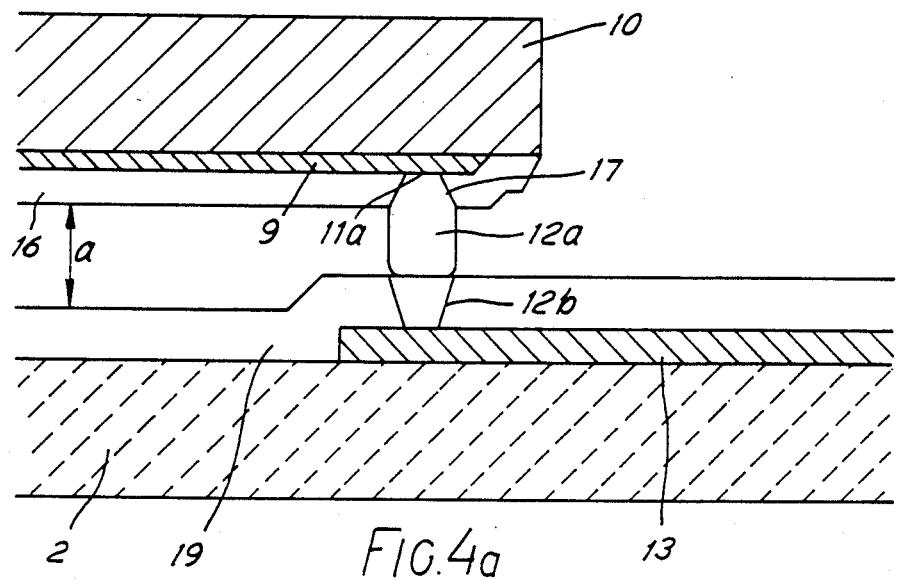
FIG. 4a is a similar view of an alternative embodiment.

FIG. 1 shows a current sensing device produced in accordance with the invention. The device comprises a chip, not shown, mounted on a ceramic substrate 2. Substrate 2 has mounted on it a ceramic cap 3, and its lower major surface is attached to an upper flat surface 4 of a copper strap 5 having a constant rectangular cross-section. Strap 5 is provided with brass terminations 6 for connection in the circuit carrying the current to be sensed. Substrate 2 and ceramic cap 3 are enclosed in a polymer moulding, or preferably in a magnetic shield, or in an epoxy polymer which is impregnated with ferromagnetic material to act as a magnetic shield; any of which are represented by a reference numeral 8 in the drawings. The polymer moulding 8 is provided with fixing lugs 7. The impregnated epoxy polymer (for example) provides magnetic shielding as well as environmental protection. The chip comprises an MR sensor (best seen in FIG. 2) which includes a bridge 9 of known construction deposited on an oxidised layer of a silicon substrate 10. The bridge structure 9 is made by configuring a permalloy (Ni/Fe) film 11 to form four meander pattern resistors 9a, 9b, 9c and 9d. The nodes of the bridge 9 are connected to pads 11a, 11b, 11c and 11d. As shown in FIGS. 3 and 4a and as explained below, these pads may be connected, by means of an integral interconnection pattern, to solder elements 12a which are connected, through solder elements 12b, to metallisation 13 which is connected to terminal pins 14a–14b. Alternatively, pads 11 may be directly connected the ceramic metallisation by a known wire-bonding technique as shown in FIG. 4. In FIG. 3, substrate 2 is shown attached to the upper surface 4 of strap 5 by means of a layer of solder 15.

With the finished device (FIG. 1), terminal pins 14a and 14c are connected respectively to negative and positive sides of a voltage source (not shown) and an analog output is developed across terminal pins 14b and 14d.

In order to secure the chip to substrate 2, to connect pads 11a–11d to terminal pins 14a–14d, and to secure substrate 2 to the upper surface of copper strap 5, the following technique is employed.

As shown in FIG. 4, the bridge structure 9 on its silicon substrate 10 is covered with an insulating passivation layer 16 (e.g. by a known technique). However, vias or voids 17 are left either at the locations of electrically isolated dummy pads 11g adjacent each of the wire bonded regions 18 (FIG. 4), or at the locations of the pads 11a–11d (FIG. 4a). Solder elements 12a are then deposited on the dummy pads 11g or pads 11a–11d, e.g. by vapour phase deposition through holes in a metal mask (not shown) aligned with dummy pads 11g or pads 11. The solder is applied to each via 17 so as to leave an element 12a which extends a predetermined distance "a" above the outer surface of the insulation 16 so that, when the substrate 10 is inverted and placed on the substrate 2, the solder elements 12a support the substrate 10 with a clearance "a" between the outer surface of the insulating layer 16 and the upper surface of insulation 19 (on substrate 2).

Similarly, the substrate 2 and its metallisation 13 is covered with a layer of insulation 19 and, as shown in FIGS. 4 and 4a, vias or voids 17 are left in layer 19 at locations respectively corresponding with the positions of vias 17 in layer 16 (in other words, the vias 17 are a mirror image of one another). In FIG. 4, vias 17 in layer 19 are located over electrically isolated dummy pads 11h. Solder is then deposited in vias 17 to form elements 12b. This may be done in the same way as elements 12a were provided for the chip or screen-printed in paste form. A film or layer of solder 15 is also deposited (by a known technique) on the lower surface of substrate 2 (as shown in FIG. 3). This film of solder 15 is intended to make contact with the upper surface 4 of the copper strap 5.

Substrates 10 and 2 are then mounted on strap 4 so that the solder elements 12a and 12b are substantially aligned. In this position, the bridge structure 9 has a substantially predetermined orientation with respect to (the direction of current flow in) copper strap 5. The bridge structure 9 is also substantially parallel with the upper surface 4 of strap 5.

The sub-assembly shown in FIG. 3 is then placed on a belt (not shown) of a chain belt furnace (not shown) which has a carefully-controlled time/temperature profile. The assembly is thereby transported at constant speed through the furnace whereby the solder elements 12a, 12b soften and fuse together to cause substrate 10 to adhere to substrate 2, to ensure a good electrical connection to be made between pads 11a–11d and metallisation 13 (connected to pins 14a–14d) i.e. where this is the case with the preferred arrangement shown in FIG. 4a, and to cause substrate 2 to adhere to the upper surface 4 of copper strap 5 whilst leaving the bridge structure 9 positioned at a predetermined distance above surface 4. Ideally, for maximum sensitivity, the bridge structure 9 is positioned as close as possible to the surface 4 of the copper strap 5 allowing for the intervening substrate, insulation and metallisation. However, the thickness of substrate 2 can be controlled to provide a required sensitivity whilst preventing any undesirable short circuits.

The dimensions of the solder elements and the disposition or pattern of the vias 17 are selected or predetermined to assist in the final accurate positioning of the bridge structure, i.e. in a mass-production process. As the elements 12a, 12b become molten, their surface tension provides a self-aligning function (within tolerable limits) and the degree of softening allows the substrate 10 to sag down onto the insulating layer 19 by the required amount, i.e. due to the carefully controlled time/temperature profile in the furnace.

FIG. 5 illustrates an alternative embodiment, partly in section, in which similar components have been given similar reference numerals. In this embodiment, a similar silicon chip formed on a substrate 10 is mounted on a ceramic substrate 2 and is covered with a ceramic cap 3. The ceramic substrate 2 is mounted on a copper strap 5 which is bent back upon itself, as shown in the drawing, so as to contact the upper surface of the insulating cap 3. The sensing and power circuits are thereby electrically isolated from the strap 5. The "return path" of the strap 5 facilitates low current measurement since it increases the magnetic field in the vicinity of the bridge structure 9 for the same amount of current flowing through the strap 5.

FIG. 6 illustrates a further embodiment in which similar components have been given similar reference numerals. In this case, substrates 2 and silicon chips 5 formed on substrates 10 are mounted on opposite side of a copper strap 5. The terminal pins 14a–14d of each device are connected in an anti-coincident mode wherein the responses of the devices to an external magnetic field (interference) cancel one another, whilst the responses of the devices to magnetic fields of opposite direction, i.e. due to current flow in the copper strap 5, reinforce one another to provide a sum output.

In accordance with a further embodiment (not illustrated), a logic output triggered by a predetermined magnetic field, can be achieved by utilising either (i) a logic circuit diffused into the substrate of the chip or (ii) a logic hybrid circuit assembled and bonded onto the ceramic substrate 2.

The advantage of logic circuitry incorporated into the sensing device (i.e. where digital control around a fixed field is required) is a reduction of sense circuit connections from four to three, the incorporation of output signal conditioning (e.g. a hysteresis switch point) and the conditioning or stabilisation of the sensor drive power supply.

FIG. 7 illustrates an alternative, Barber-pole biased, bridge structure 9. In this case, the magnetoresistive element is configured in four meander pattern resistors, two of each polarity, sharing common interconnection pads 11b, 11c and 11d so as to provide a "push-pull" bridge format when pads 11a and 11d are commonly connected by metallisation 13. Certain portion of this bridge structure, as illustrated by the magnified inserts, one of each polarity, show conductive stripes 21 (e.g. of aluminium) each having a predetermined angle of inclination. The shading on the stripes 21, which is in the same direction, is merely intended to distinguish the stripes 21 from the underlining magnetoresistive element, e.g. a permalloy stripe 11 in the drawing.)

Whilst embodiments of the invention have been described in detail, further modification and/or changes may be made without departing from the scope of invention.

We claim:

1. A method of making a current sensing device comprising a magnetoresistive element configured into a bridge, the method comprising the steps of:
    (a) providing a first insulating substrate on which said bridge is disposed together with a first layer of insulation having first vias therein at predetermined positions;
    (b) depositing a plurality of first elements of thermally softenable material in said first vias, each element being of a first predetermined volume;
    (c) providing a second substrate, having a predetermined thickness and on which there is a second layer of insulation with second vias therein at positions corresponding with those of said first vias, for attachment to a surface of an electrically conductive member having a predetermined shape, wherein said conductive member is provided for conducting the current to be sensed;
    (d) depositing second elements of thermally softenable material in said second vias, each element being of a second predetermined volume;
    (e) sub-assembling said first and second substrate and said conductive member so that (i) said second substrate is disposed between said first substrate and said conductive member, (ii) the first and second elements of thermally softenable material are in contact with each other, thereby providing a clearance between said first and second layers of insulation; the positions of said first and second vias being such that, when said first and second substrates are sub-assembled, said bridge has a substantially predetermined orientation with respect to said conductive member;
    (f) applying heat to said assembled first and second substrates and said conductive member, in a controlled manner, thereby causing said first and second elements to melt sufficiently causing a degree of self-alignment of said bridge with respect to said conductive member and causing said bridge to be disposed substantially parallel to said surface of said conductive member at a predetermined distance therefrom, and thereby attaching said first substrate to said second substrate and said second substrate to said conductive member.

2. The method according to claim 1 wherein said elements project by a predetermined distance beyond a surface of the insulating substrates.

3. The method according to claim 1 wherein said thermally softenable material is solder.

4. The method according to claim 1 wherein said conductive member has a rectangular cross-section.

5. The method according to claim 1 wherein said bridge has Barber pole biasing.

6. The method according to claim 1 wherein means are provided to establish an auxiliary magnetic field.

7. The method according to claim 1 said conductive member is configured so as to have a return path adjacent said bridge.

8. The method according to claim 1 comprising said sensor such that it is one of two which are sub-assembled on the same conductive member and which have their respective bridges connected in an anti-coincident mode.

9. The method according to claim 1 comprising said sensor such that it comprises circuitry to provide a logic output which is triggered by a predetermined magnetic field caused by current flow in said conductive member.

* * * * *

UNITED STATES PATENT AND TRADEMARK OFFICE
CERTIFICATE OF CORRECTION

PATENT NO. : 4,922,606

DATED : May 8, 1990

INVENTOR(S) : ALEXANDER et al.

It is certified that error appears in the above-identified patent and that said Letters Patent is hereby corrected as shown below:

On the title page,
[73] Assignee, cancel "Honeywell Inc., Minneapolis, Minn." and substitute --Honeywell Control Systems Limited, United Kingdom--

Signed and Sealed this

First Day of October, 1991

Attest:

HARRY F. MANBECK, JR.

*Attesting Officer*  *Commissioner of Patents and Trademarks*